United States Patent [19]
Zambrano

[11] Patent Number: 5,491,357
[45] Date of Patent: Feb. 13, 1996

[54] INTEGRATED STRUCTURE CURRENT SENSING RESISTOR FOR POWER MOS DEVICES, PARTICULARLY FOR OVERLOAD SELF-PROTECTED POWER MOS DEVICES

[75] Inventor: Raffaele Zambrano, Catania, Italy

[73] Assignee: Consorzio Per La Ricerca Sulla Microelettronica Nel Mezzogiorno, Catania, Italy

[21] Appl. No.: 481,198

[22] Filed: Jun. 7, 1995

Related U.S. Application Data

[63] Continuation of Ser. No. 242,261, May 13, 1994, abandoned.

[30] Foreign Application Priority Data

May 19, 1993 [EP] European Pat. Off. .............. 93830207

[51] Int. Cl.⁶ .............................. H01L 27/04; H01L 27/08
[52] U.S. Cl. .......................... 257/337; 257/154; 257/341; 257/379
[58] Field of Search .................. 257/337, 338, 257/339, 328, 154, 341, 379, 923, 334, 358, 360

[56] References Cited

FOREIGN PATENT DOCUMENTS

| 3821065 | 1/1989 | Germany | 257/337 |
| 62-143450 | 6/1987 | Japan | 257/379 |
| 4-100276 | 4/1992 | Japan | 257/337 |
| WO89/08928 | 9/1989 | WIPO | 257/337 |
| WO91/09424 | 6/1991 | WIPO | 257/337 |

*Primary Examiner*—Donald L. Monin, Jr.
*Attorney, Agent, or Firm*—David V. Carlson; Bryan A. Santarelli; Seed and Berry

[57] ABSTRACT

In integrated structure sensing resistor for a power MOS device consists of a doped region extending from a deep body region of at least one cell of a first plurality of cells, constituting a main power device, to a deep body region of a corresponding cell of a second smaller plurality of cells constituting a current sensing device.

33 Claims, 3 Drawing Sheets

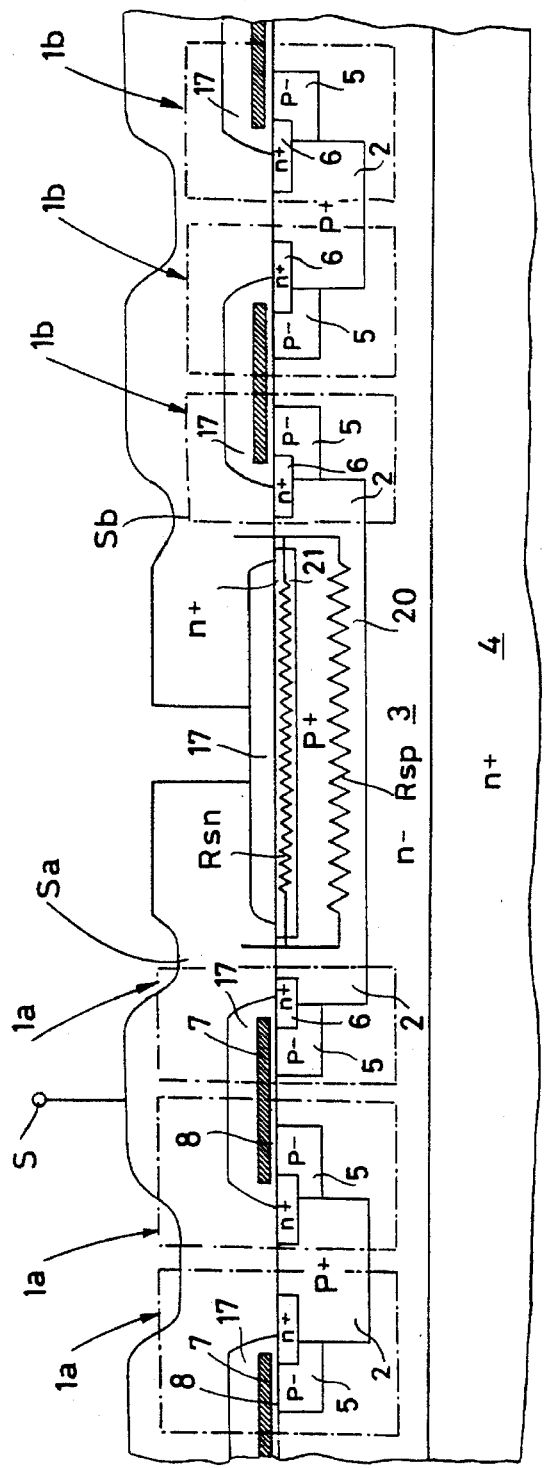
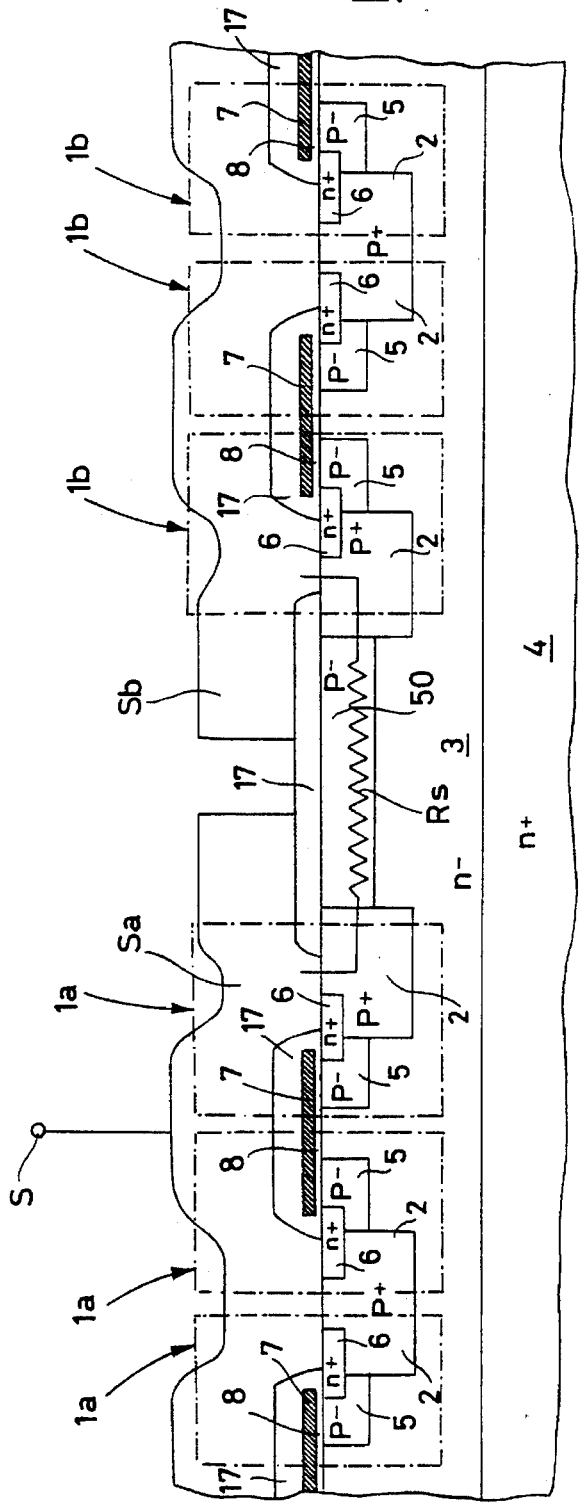

INTEGRATED STRUCTURE CURRENT SENSING RESISTOR FOR POWER MOS DEVICES, PARTICULARLY FOR OVERLOAD SELF-PROTECTED POWER MOS DEVICES

CROSS-REFERENCE TO RELATED APPLICATION

This application is a continuation of U.S. patent application Ser. No. 08/242,261, filed May 13, 1994, now abandoned.

TECHNICAL FIELD

The present invention relates to an integrated structure current sensing resistor for power MOS devices, particularly for overload self-protected power MOS devices.

BACKGROUND OF THE INVENTION

Power MOS devices can feature integrated circuitry suitable to protect the power device against excessive current flow, due for example to an output load short-circuit.

A typical solution provides for a negative feedback loop, which comprises a current sensing MOSFET, whose drain and gate are respectively connected to the drain and the gate of the main power MOSFET, and whose source is connected, through a current sensing resistor, to the source terminal of the integrated component. The base-emitter junction of a bipolar junction transistor (BJT) is connected across said sensing resistor, while the collector of the BJT is connected to the common gate of the two MOSFETs. A gate resistor is finally connected in series between an external gate terminal of the integrated component and the common gate.

In practical implementations, both the sensing MOSFET and the main power MOSFET are made up of similar cells, even if the latter comprises a much larger number of such cells than the former.

The current flowing through the sensing MOSFET, which is a small fraction of the current flowing through the main power MOSFET, generates a voltage drop across the sensing resistor whose value is chosen in such a way that when the current flowing through the power MOSFET exceeds a prescribed maximum value, the fractional current flowing through the sensing resistor generates a voltage drop sufficient to turn on the BJT. By draining current from the gate resistor through the BJT, the voltage applied to the gate of the two MOSFETs decreases, thus preventing the current flowing through them from further increasing.

Furthermore, the positive thermal coefficient of such feedback loop improves the protecting performances of this protection circuit, since at higher temperature the maximum value for the current decreases.

In the International Application No. WO 91/09424, a power device is described which includes in the same substrate as the power transistor a feedback loop of the type described above. The sensing resistor is made up of a polysilicon strip obtained simultaneously with the polysilicon gate layer of the MOS cells.

This solution requires a dedicated area on the substrate surface to allocate the sensing resistor, which is external to the sequence of source cells.

SUMMARY OF THE INVENTION

In view of the state of the art described, the object of the present invention is to provide an integrated structure sensing resistor which reduces the area used on the substrate surface.

According to the present invention, such object is attained by means of an integrated structure current sensing resistor for a power MOS device comprising a main power device and a current sensing device respectively made up of a first plurality and a second plurality of identical cells arranged in an array, each of them comprising a deep body region of a first conductivity type obtained in a semiconductor material of a second conductivity type, a lateral channel region of said first conductivity type and a source region of said second conductivity type extending partially in said deep body region and partially in said lateral channel region, a conductive gate layer, insulated from a top surface of the semiconductor material by a thin gate oxide layer superimposed over said channel region, the deep body region and the source region of each cell of said first and second pluralities being electrically connected to each other and to all the other cells of the same plurality by means of respective first and second superimposed conductive source electrodes, characterized in that said resistor consists of at least one doped region extending from the deep body region of at least one cell of the first plurality to the deep body region of a corresponding cell of the second plurality.

In a first embodiment of the present invention, the integrated structure current sensing resistor consists of an extended deep body region of the first conductivity type, extending from and connecting the deep body region of said at least one cell of the first plurality to the deep body region of said corresponding cell of the second plurality.

In a second embodiment of the present invention, the integrated structure current sensing resistor consists of a semiconductor region of the second conductivity type, arranged within an extended deep body region of the first conductivity type extending from and connecting the deep body region of said at least one cell of the first plurality to the deep body region of said corresponding cell of the second plurality.

In a third embodiment of the present invention, the integrated structure current sensing resistor consists of a body region of the first conductivity type extending from and connecting the deep body region of said at least one cell of the first plurality to the deep body region of said corresponding cell of the second plurality.

Thanks to the present invention, it is possible to obtain an integrated structure current sensing resistor without introducing irregularities in the array of cells of the power device, consequently reducing the area required.

BRIEF DESCRIPTION OF THE DRAWINGS

Three embodiments of the present invention will now be described in greater detail with reference to the annexed drawings.

FIG. 3 is a cross-sectional view of an integrated structure current sensing resistor according to a variation of said second embodiment.

FIG. 4 is a cross-sectional view of an integrated structure current sensing resistor according to a third embodiment of the invention.

DETAILED DESCRIPTION OF THE INVENTION

Figure 1:
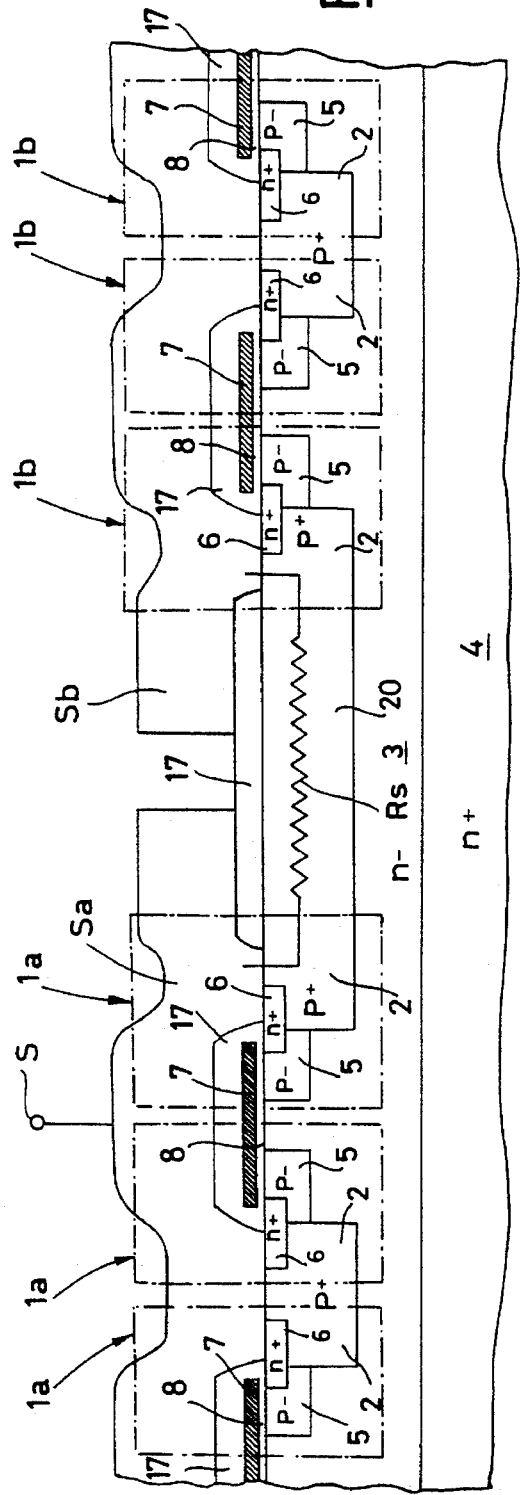
FIG. 1 is a cross-sectional view of an integrated structure current sensing resistor according to a first embodiment of the invention.

A power MOS device, for example an n-channel power MOSFET, is made up of a plurality of cells 1a and 1b, each comprising a high doped $p^+$ deep body region 2, extending from a top surface of a semiconductor material into a low doped $n^-$ epitaxial layer 3. The $n^-$ epitaxial layer 3 is grown over a high doped $n^+$ substrate 4 and represents a drain region of the power MOSFET. On one side of said $p^+$ deep body region 2, a low doped $p^-$ channel regions 5 is provided, and a highly doped $n^+$ source region 6 extends partially in the $p^+$ deep body region 2 and partially in said channel region 5. A polysilicon gate layer 7, insulated from the top surface of the semiconductor by a thin gate oxide layer 8, is superimposed over said channel region 5 to allow, under particular biasing conditions, the formation of a conductive channel.

An array of cells 1a, connected each other by means of a first source electrode layer Sa which contacts their $p^+$ deep body region 2 and their $n^+$ source region 6, constitutes a main power MOSFET, while a smaller array of cells 1b, which are in turn connected each other in the same way by means of a second source electrode layer Sb, constitutes a sensing MOSFET.

In a first embodiment, shown in FIG. 1, the $p^+$ deep body region 2 of at least one of the main power MOSFET's cells 1a is laterally extended in order to be merged with the $p^+$ deep body region 2 of a corresponding cell 1b of the sensing MOSFET, and an extended deep body region 20 is thus obtained which is contacted on opposite sides by the source electrodes Sa and Sb respectively. Such source electrodes Sa and Sb are thus electrically connected by the extended $p^+$ deep body region 20, which introduces, in series connection to the source electrode Sb of the sensing MOSFET, a sense resistor Rs.

Figure 2:
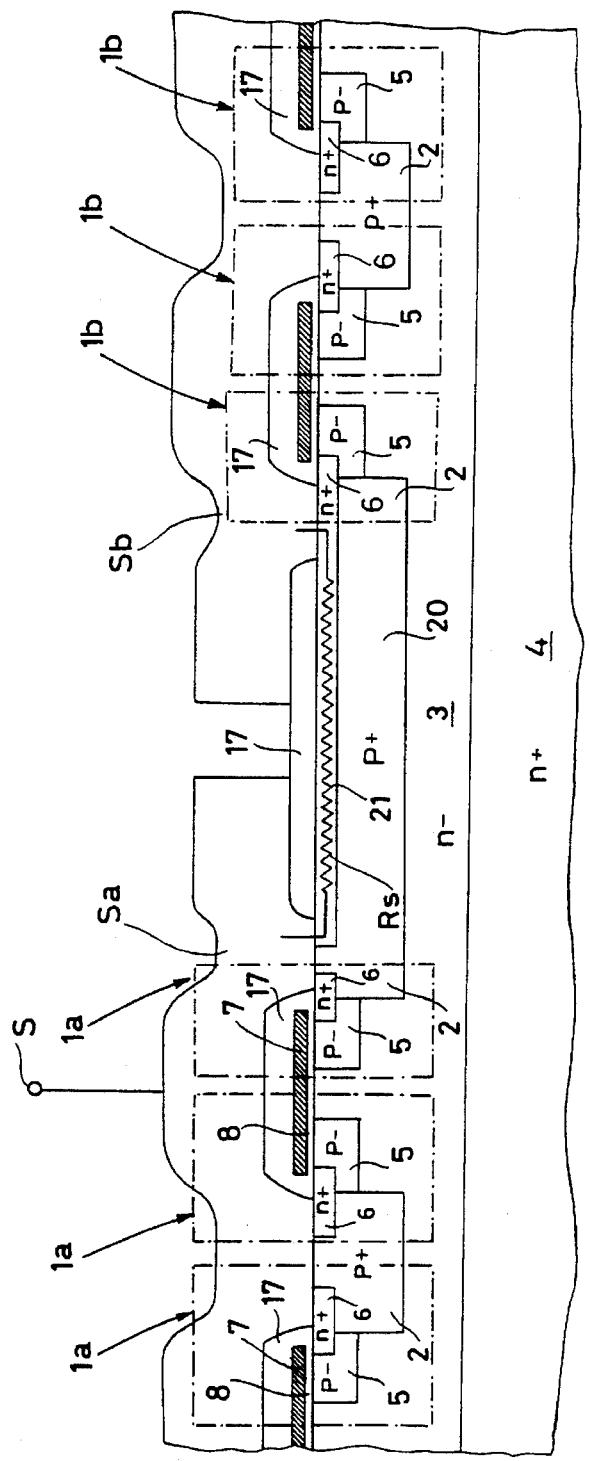
FIG. 2 is a cross-sectional view of an integrated structure current sensing resistor according to a second embodiment of the invention.

In a second embodiment, shown in FIG. 2, the $p^+$ deep body region 2 of at least one of the main power MOSFET's cells 1a is again extended and merged with the $p^+$ deep body region 2 of a corresponding cell 1b of the sensing MOSFET, to obtain, as in the previous embodiment, an extended deep body region 20. An extended $n^+$ semiconductor region 21 is then provided within the deep body region 20 and is merged with the $n^+$ source region 6 of said corresponding cell 1b. The source electrodes Sa and Sb contact two sides of the extended $n^+$ semiconductor region 21, which introduced, in series connection between the source electrodes Sa and Sb, a sense resistor Rs'. The extended $p^+$ deep body region 20 insulates the extended $n^+$ semiconductor region 21 from the $n^-$ epitaxial layer 3, and is connected to the source electrode Sa to prevent all parasitic actions.

The first source electrode Sa is also connected to an external source terminal S of the integrated component.

The polysilicon gate layer 7 is connected, through an integrated gate resistor not shown in the drawings, to a gate terminal, while a bipolar junction transistor, equally not shown, has its base-emitter junction connected across the sense resistor Rs'. A negative feedback loop of the type described before is thus obtained.

In a variation of the second embodiment, shown in FIG. 3, the extended $p^+$ deep body region 20 and the extended $n^+$ semiconductor region 21 are both contacted on opposite sides, thus introducing, in series connection between source electrodes Sa and Sb, two parallelly connected resistors Rsp and Rsn.

In a third embodiment shown in FIG. 4, there is no extended $p^+$ deep body region; a $p^-$ body region 50 is formed so as to connect the deep body region 2 of at least one cell 1a of the first plurality to the deep body region 2 of a corresponding cell 1b of the second plurality, serially connecting the cells 1a and 1b through a resistor Rs". Since the resistivity of the $p^-$ regions is considerably higher than that of the $p^+$ regions, the resistance introduced by the body region 50 is considerably higher than that introduced by the region 20 of the previous embodiments.

In all of the described embodiments, there can be several extended regions connected in parallel between the first and the second pluralities of cells: the resistance between the two source regions will be given by the parallel computation of all of them.

A fabrication process suitable to obtain a power MOS device featured by the integrated structure current sensing resistor according to the first embodiment of the present invention is shown in FIGS. 5–9 and includes the same steps of a known process for the fabrication of a power MOS device. The fabrication process starts with the growth of the low-doped epitaxial layer 3, for example of the $n^-$ type, over the highly-doped semiconductor substrate 4, in this example of the $n^+$ type.

Figure 5:
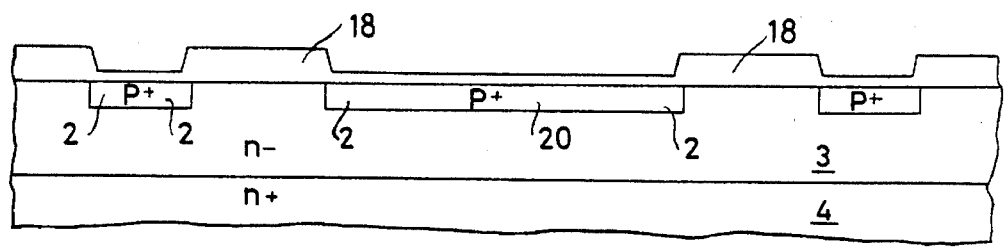
FIGS. 5–9 are cross-sectional views of a sequence of steps in a fabrication process of a power MOS device provided with the integrated structure current sensing resistor according to the first embodiment of the invention.

After a field oxide layer 18 has been grown, a masked implantation and subsequent diffusion of a high concentration of a p type dopant is performed, in order to form the plurality of $p^+$ deep body regions 2 constituting the main and sensing cells 1a and 1b of the power MOSFET, and the extended $p^+$ deep body region 20 (FIG. 5).

Figure 6:
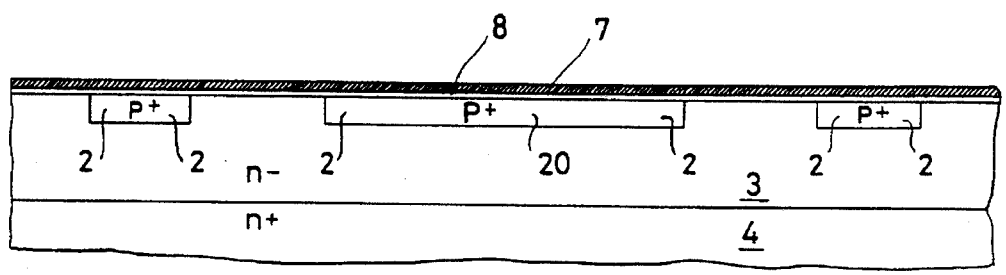

After a masking step, active areas are defined, on the surface of the epitaxial layer 3, a thin gate oxide layer 8 is then grown over said active areas, and a polysilicon gate layer 7 is subsequently deposited over said gate oxide layer 8, and doped to achieve low resistivity (FIG. 6).

Figure 7:
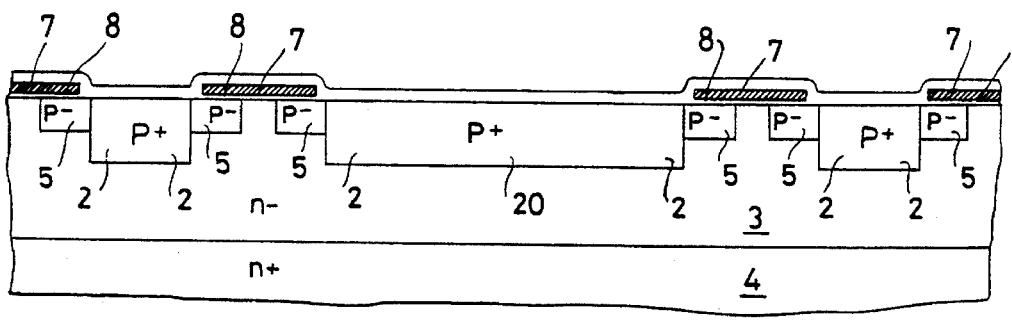

The polysilicon gate layer 7 is then selectively etched outside said gate regions, and after a masking step, a low concentration of a p type dopant is implanted and diffused under said gate regions to form $p^-$ type channel regions 5 of each cell 1a and 1b of the power MOSFET (FIG. 7).

Figure 8:
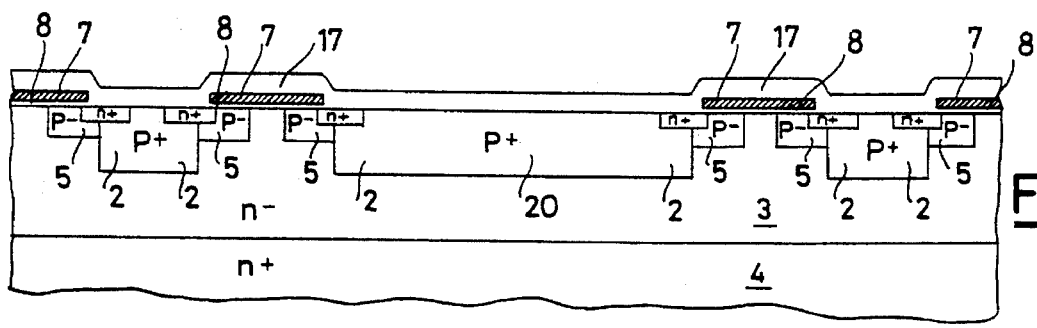

The following step is the masked implant and diffusion of a high concentration of an n type dopant at the sides of said gate regions, to form the source regions 6 of the cells 1a and 1b, and the deposition of an insulating oxide layer 17 over the polysilicon gate layer 7 (FIG. 8).

Figure 9:
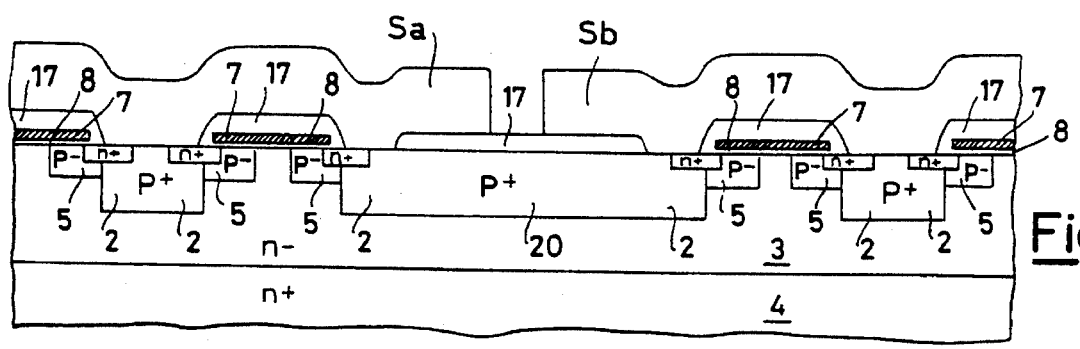

The final steps of the process involve the definition of contact areas, the deposition of a conductive layer suitable to form the two source electrodes Sa and Sb, and the deposition of a passivating layer (FIG. 9).

The metallization of the bottom surface of the substrate 4 is also provided, in order to form a contact to the drain of the power MOSFET.

Based on the detailed description provided herein, those skilled in the art will recognize that the structure according to the invention can also be used in Insulated Gate Bipolar Transistors (IGBTs), simply by starting the fabrication process with a p-type, heavily doped substrate, on which an n-type epilayer similar to the epilayer 3 described before is then grown.

Also, the invention applies to p-channel devices; in this case it is necessary to substitute p-type regions for n-type regions and vice versa.

The invention applies also to integrated devices, where the drain electrode lies on the same surface as the source and gate electrodes; the modifications to the described process being known to those skilled in the art.

Although specific embodiments of the invention have been described for purposes of illustration, various modifications may be made, such as those described above, without departing from the spirit and scope of the invention, as will be recognized by those skilled in the art based on the description provided herein. Accordingly, the invention is not limited by the disclosure, but instead its scope is to be determined entirely by reference to the following claims.

I claim:

1. An integrated structure current sensing resistor for a power MOS device comprising a main power device and a current sensing device respectively made up of a first plurality of a second plurality of identical cells arranged in an array, each of them comprising a deep body region of a first conductivity type obtained in a semiconductor material of a second conductivity type, a lateral channel region of said first conductivity type and a source region of said second conductivity type extending partially in said deep body region and partially in said lateral channel region, an conductive gate layer, insulated from a top surface of the semiconductor material by a thin gate oxide layer superimposed over said channel region, the deep body region and the source region of each cell of the first plurality being electrically connected to each other, and the deep body region and the source region of each cell of the second plurality being electrically connected to each other, by means of respective first and second superimposed conductive source electrodes, characterized in that said integrated structure sensing resistor is formed in at least one doped region which is an interconnecting portion integrally coupled to the deep body region of at least one cell of the first plurality and of the deep body region of a corresponding cell of the second plurality, said sensing resistor having a first end contacted by said first source electrode through a same contact opening through which the first source electrode contacts the source and deep body regions of said at least one cell of the first plurality and a second end contacted by said second source electrode through a same contact opening through which the second source electrode contacts the source and deep body regions of said corresponding cell of the second plurality.

2. An integrated structure current sensing resistor according to claim 1, characterized in that said doped region is an extended deep body region of the first conductivity type, merged with the deep body region of said at least one cell of the first plurality and with the deep body region of said corresponding cell of the second plurality.

3. An integrated structure current sensing resistor according to claim 1, characterized in that it further comprises a semiconductor region of the second conductivity type, arranged within said doped region, this last being an extended deep body region of the first conductivity type merged with the deep body region of said at least one cell of the first plurality and with the deep body region of said corresponding cell of the second plurality.

4. An integrated structure current sensing resistor according to claim 1, characterized in that said doped region is a body region of the first conductivity type merged with the deep body region of said at least one cell of the first plurality and with the deep body region of said corresponding cell of the second plurality.

5. An integrated structure current sensing resistor according to claim 1, characterized in that it consists of a plurality of parallelly connected doped regions, each being an interconnecting portion integrally coupled to the deep body region of a respective cell of the first plurality of cells and of the deep body region of a corresponding cell of the second plurality of cells.

6. An integrated structure current sensing resistor according to claim 1, characterized in that said first conductivity type regions are semiconductor regions doped with acceptor impurities, while said second conductivity type regions are semiconductor regions doped with donor impurities.

7. An integrated structure current sensing resistor according to claim 6, characterized in that said deep body regions and said extended deep body region of a first conductivity type are $p^+$ type semiconductor regions.

8. An integrated structure current sensing resistor according to claim 6, characterized in that said lateral channel regions and body region of a first conductivity type are $p^-$ type semiconductor regions.

9. An integrated structure current sensing resistor according to claim 6, characterized in that said source regions of a second conductivity type are $n^+$ type semiconductor regions.

10. An integrated structure current sensing resistor according to claim 1, characterized in that said first conductivity type regions are semiconductor regions doped with donor impurities, while said second conductivity type regions are semiconductor regions doped with acceptor impurities.

11. An integrated structure current sensing resistor according to claim 10, characterized in that said deep body regions and said extended deep body region of a first conductivity type are $n^+$ type semiconductor regions.

12. An integrated structure current sensing resistor according to claim 10, characterized in that said lateral channel regions and body region of a first conductivity type are $n^-$ type semiconductor regions.

13. An integrated structure current sensing resistor according to claim 10, characterized in that said source regions of a second conductivity type are $p^+$ type semiconductor regions.

14. An integrated structure current sensing resistor according to claim 1, characterized in that said semiconductor material of the second conductivity type is an epitaxial layer grown on a semiconductor substrate.

15. An integrated structure current sensing resistor according to claim 14, characterized in that said semiconductor substrate is of said first conductivity type.

16. An integrated structure current sensing resistor according to claim 14, characterized in that said semiconductor substrate is of said second conductivity type.

17. An integrated protection circuit for protecting an integrated power MOS device comprising:

a semiconductor substrate;

a first plurality of cells forming a MOS power device;

a second plurality of cells forming a current sensing device;

each of the cells having a body region of a first conductivity type formed in an upper surface of a layer of a second conductivity type that is formed on an upper surface of the semiconductor substrate, a channel region of the first conductivity type formed in the upper surface of the layer, and a source region of the second conductivity type formed and extending partially in the body region and partially in the channel region; and a first interconnecting doped region of one of the first and second conductivity types forming a first resistor, the first interconnecting doped region connected to, and immediately contiguous with the body region of a least one cell of the first plurality of cells and to the body region of a corresponding cell of the second plurality of cells within the substrate.

18. The integrated protection circuit of claim 17 wherein the body regions are deep body regions and the first interconnecting doped region is of the first conductivity type.

19. The integrated protection circuit of claim 18, further comprising a second interconnecting doped region of the second conductivity type forming a second resistor, the second interconnecting doped region formed in an upper surface of the first interconnecting doped region and being integrally connected between the deep body region of the one cell of the first plurality of cells, and the deep body region of the corresponding cell of the second plurality of cells.

20. The integrated protection circuit of claim 17 wherein the first interconnecting doped region is of the second conductivity type and is connected to the source region of the corresponding cell of the second plurality of cells.

21. The integrated protection circuit of claim 17 wherein the body regions are highly doped deep body regions of the first conductivity type and the first interconnecting region is of a lightly doped first conductivity type.

22. An integrated structure current sensing resistor for a power MOS device comprising: a main power device and a current sensing device respectively made up of a first plurality and a second plurality of identical cells arranged in an array, each of them comprising a deep body region of a first conductivity type obtained in a semiconductor material of a second conductivity type, a lateral channel region of said first conductivity type and a source region of said second conductivity type extending partially in said deep body region and partially in said lateral channel region, a conductive gate layer, insulated from a top surface of the semiconductor material by a thin gate oxide layer superimposed over said channel region, the deep body region and the source region of each cell of the first plurality being electrically connected to each other, and the deep body region and the source regions of each cell of the second plurality being electrically connected to each other, by means of respective first and second superimposed conductive source electrodes, said integrated structure sensing resistor having a plurality of parallel connected doped regions, each being an interconnecting portion with the deep body region of a respective cell of the first plurality of cells and of the deep body region of a corresponding cell of the second plurality of cells.

23. The integrated structure current sensing resistor according to claim 22, characterized in that each of said doped regions is an extended deep body region of the first conductivity type, merged with the deep body region of said respective cell of the first plurality and with deep body region of said corresponding cell of the second plurality.

24. The integrated structure current sensing resistor according to claim 22, characterized in that it further comprises a plurality of semiconductor regions of the second conductivity type, each arranged within a respective one of said doped regions, each of said doped regions being an extended deep body region of the first conductivity type merged with the deep body region of said respective cell of the first plurality and with the deep body region of said corresponding cell of the second plurality.

25. The integrated structure current sensing resistor according to claim 22, characterized in that each of said doped regions is a body region of the first conductivity type merged with the deep body region of said respective cell of the first plurality and with the deep body region of said corresponding cell of the second plurality.

26. The integrated structure current sensing resistor according to claim 22, characterized in that said deep body regions of the first conductivity type are semiconductor regions which are doped more heavily than said lateral channel regions and body regions of the first conductivity type.

27. The integrated structure current sensing resistor according to claim 22, characterized in that said semiconductor material layer of the second conductivity type is formed over a semiconductor substrate of the first conductivity type.

28. The integrated current sensing resistor according to claim 22, characterized in that said semiconductor material layer of the second conductivity type is formed over a semiconductor substrate of the second conductivity type.

29. The integrated structure current sensing resistor according to claim 22, characterized in that said first conductivity type regions are semiconductor regions doped with acceptor impurities, while said second conductivity type regions are semiconductor regions doped with donor impurities.

30. The integrated structure current sensing resistor according to claim 22, characterized in that said first conductivity type regions are semiconductor regions doped with donor impurities, while said second conductivity type regions are semiconductor regions doped with acceptor impurities.

31. An integrated protection circuit for protecting an integrated power MOS device comprising:

a semiconductor substrate;

a first plurality of cells forming a MOS power device;

a second plurality of cells forming a current sensing device;

each of the cells having a body region of a first conductivity type formed in an upper surface of a layer of a second conductivity type that is formed on an upper surface of the semiconductor substrate, a channel region of the first conductivity type formed in the upper surface of the layer, and a source region of the second conductivity type formed and extending partially in the body region and partially in the channel region; and first and second interconnecting doped regions of one of the first and second conductivity types forming respective first and second resistors, the first and second interconnecting doped regions connected to, and immediately contiguous with, the body region of at least one cell of the first plurality of cells and to the body region of a corresponding cell of the second plurality of cells, the first interconnecting doped region formed within the substrate, and the second interconnecting doped region formed in an upper surface of the first interconnecting doped region.

32. An integrated protection circuit for protecting an integrated power MOS device comprising:

a semiconductor substrate;

a first plurality of cells forming a MOS power device;

a second plurality of cells forming a current sensing device;

each of the cells having a body region of a first conductivity type formed in an upper surface of a layer of a second conductivity type that is formed on an upper surface of the semiconductor substrate, a channel region of the first conductivity type formed in the upper surface of the layer, and a source region of the second conductivity type formed and extending partially in the body region and partially in the channel region;

a first interconnecting doped region of the first conductivity type forming a first resistor, the first interconnecting doped region connected to, and immediately contiguous with, the body region of at least one cell of the first plurality of cells and to the body region of a corresponding cell of the second plurality of cells within the substrate; and an oxide layer formed over the first interconnecting doped region.

33. An integrated protection circuit for protecting an integrated power MOS device comprising:

a semiconductor substrate;

a first plurality of cells forming a MOS power device;

a second plurality of cells forming a current sensing device;

each of the cells having a body region of a first conductivity type formed in an upper surface of a layer of a second conductivity type that is formed on an upper surface of the semiconductor substrate, a channel region of the first conductivity type formed in the upper surface of the layer, and a source region of the second conductivity type formed and extending partially in the body region and partially in the channel region; and a first interconnecting doped region of the first conductivity type forming a first resistor, the first interconnecting doped region connected to, and immediately contiguous with, the body region of a least one cell of the first plurality of cells and to the body region of a corresponding cell of the second plurality of cells, the first interconnecting doped region extending laterally within the substrate a lateral distance substantially greater than a lateral distance extended by the body region of at least the second plurality of cells.

* * * * *

UNITED STATES PATENT AND TRADEMARK OFFICE
CERTIFICATE OF CORRECTION

PATENT NO. : 5,491,357
DATED : February 13, 1996
INVENTOR(S) : Raffaele Zambrano It is certified that error appears in the above-indentified patent and that said Letters Patent is hereby corrected as shown below:

In column 5, claim 1, line 22, following "plurality", please delete "of" and insert therefor--and--.

In column 5, claim 1, line 28, please delete "an" and insert therefor--a--.

In column 5, claim 1, line 46, following "plurality", please insert--,--.

In column 7, claim 17, line 4, please delete "a" and insert therefor--at--.

Signed and Sealed this

Second Day of July, 1996

Attest:

BRUCE LEHMAN

Attesting Officer

Commissioner of Patents and Trademarks